US011270743B1

(12) United States Patent
Kim

(10) Patent No.: US 11,270,743 B1
(45) Date of Patent: Mar. 8, 2022

(54) ELECTRONIC DEVICES CONTROLLING A POWER SUPPLY

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/151,580

(22) Filed: Jan. 18, 2021

(30) Foreign Application Priority Data

Sep. 8, 2020 (KR) .................. 10-2020-0114791

(51) Int. Cl.
*G11C 7/00* (2006.01)
*G11C 7/12* (2006.01)
*G11C 7/10* (2006.01)
*G11C 7/22* (2006.01)
*G11C 5/14* (2006.01)

(52) U.S. Cl.
CPC .............. *G11C 7/12* (2013.01); *G11C 5/14* (2013.01); *G11C 7/1048* (2013.01); *G11C 7/22* (2013.01); *G11C 2207/229* (2013.01)

(58) Field of Classification Search
CPC ........... G11C 7/12; G11C 5/14; G11C 7/1048; G11C 7/22; G11C 2207/229
USPC ........................................ 365/203
See application file for complete search history.

(56) References Cited

U.S. PATENT DOCUMENTS

| 10,978,170 B2* | 4/2021 | Lee ................. G11C 29/36 |
| 2008/0279016 A1* | 11/2008 | Jang ................ G11C 5/144 365/189.05 |
| 2020/0082889 A1* | 3/2020 | Yu ................... G11C 11/4074 |

FOREIGN PATENT DOCUMENTS

KR          101914296 B1    11/2018

* cited by examiner

*Primary Examiner* — Huan Hoang
(74) *Attorney, Agent, or Firm* — William Park & Associates Ltd.

(57) ABSTRACT

An electronic device includes a control signal generation circuit and a control circuit. The control signal generation circuit is configured to generate a command power control signal, a status power control signal, an address power control signal, and a pre-charge power control signal which are enabled to control a supply of power voltages during a write operation and an auto-pre-charge operation. The control circuit is configured to receive the power voltages to generate a write signal, a write pre-charge signal, a bank address signal, an internal address signal, and an auto-pre-charge address signal based on an internal chip selection signal and an internal command/address signal while the command power control signal, the status power control signal, the address power control signal, and the pre-charge power control signal are enabled.

21 Claims, 18 Drawing Sheets

ELECTRONIC DEVICES CONTROLLING A POWER SUPPLY

CROSS-REFERENCE TO RELATED APPLICATIONS

The present application claims priority under 35 U.S.C. 119(a) to Korean Application No. 10-2020-0114791, filed on Sep. 8, 2020, which is incorporated herein by reference in its entirety.

BACKGROUND

1. Technical Field

Embodiments of the present disclosure relate to electronic devices controlling a power supply to a control circuit for controlling a write operation and an auto-pre-charge operation.

2. Related Art

In general, semiconductor devices such as double data rate synchronous dynamic random access memory (DDR SDRAM) devices perform a read operation and a write operation according to commands provided by an external chip set device. In order that the semiconductor devices perform the read operation or the write operation, each of the semiconductor devices performs an active operation. The semiconductor devices may successively receive a command and an address through a command/address pin to generate an active command and an internal address for performing the active operation and may separate the command from the address using a chip selection signal.

SUMMARY

According to an embodiment, an electronic device includes a control signal generation circuit and a control circuit. The control signal generation circuit is configured to generate a command power control signal, a status power control signal, an address power control signal, and a pre-charge power control signal which are enabled to control a supply of power voltages during a write operation and an auto-pre-charge operation. The control circuit is configured to receive the power voltages to generate a write signal, a write pre-charge signal, a bank address signal, an internal address signal, and an auto-pre-charge address signal based on an internal chip selection signal and an internal command/address signal while the command power control signal, the status power control signal, the address power control signal, and the pre-charge power control signal are enabled.

According to another embodiment, an electronic device includes a control signal generation circuit and a control circuit. The control signal generation circuit is configured to generate a command power control signal and an address power control signal which are enabled to control a supply of power voltages during a write operation according to a logic level combination of an internal chip selection signal and an internal command/address signal. The control circuit is configured to receive the power voltages to generate a write signal, a bank address signal, and an internal address signal based on the internal chip selection signal and the internal command/address signal while the command power control signal and the address power control signal are enabled.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set before the process or the algorithm starts or may be set in a period during which the process or the algorithm is executed.

It will be understood that although the terms "first," "second," "third," etc. are used herein to describe various elements, these elements should not be limited by these terms. These terms are used to distinguish one element from another element and are not intended to imply a number or order of elements. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment, or vice versa.

Various embodiments of the present disclosure will be described hereinafter in detail with reference to the accompanying drawings. However, the embodiments described herein are for illustrative purposes only and are not intended to limit the scope of the present disclosure.

Figure 1:
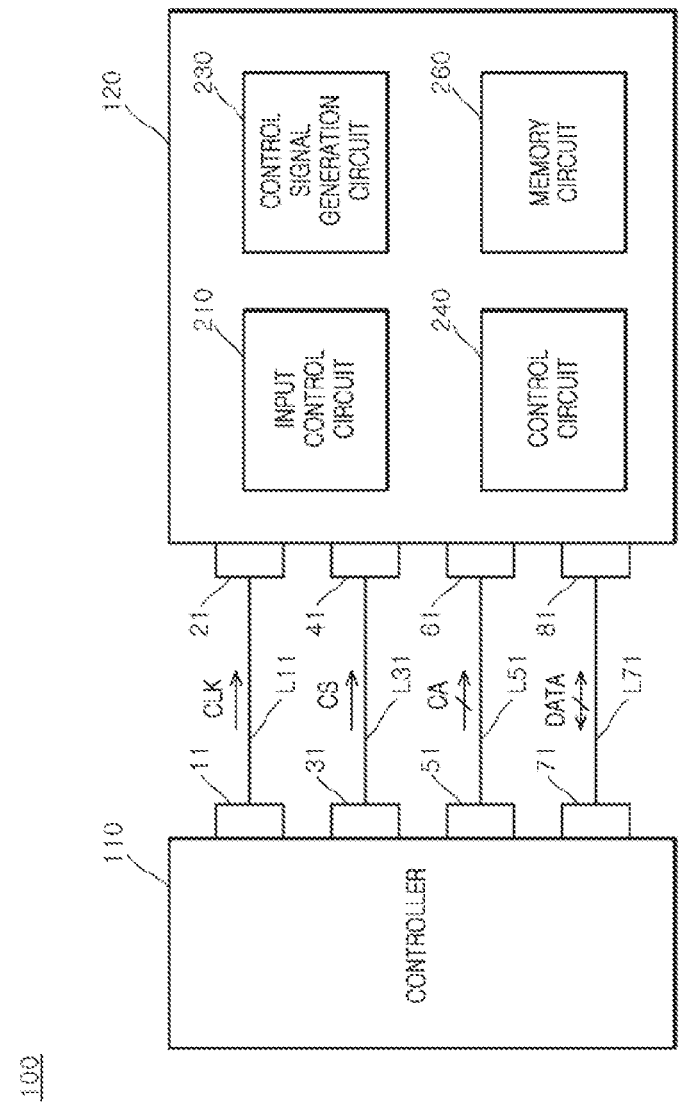
FIG. 1 is a block diagram illustrating a configuration of an electronic device according to an embodiment of the present disclosure.

As illustrated in FIG. 1, an electronic device 100 according to an embodiment may include a controller 110 and a semiconductor device 120. The semiconductor device 120 may include an input control circuit 210, a control signal generation circuit 230, a control circuit 240, and a memory circuit 260.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. The first control pin 11 and the first semiconductor pin 21 may be connected to each other by a first transmission line 11. The second control pin 31 and the second semiconductor pin 41 may be connected to each other by a second transmission line L31. The third control pin 51 and the third semiconductor pin 61 may be connected to each other by a third transmission line L51. The fourth control pin 71 and the fourth semiconductor pin 81 may be connected to each other by a fourth transmission line L71. The controller 110 may transmit a clock signal CLK to the semiconductor device 120 through the first transmission line L11 to control the semiconductor device 120. The controller 110 may transmit a chip selection signal CS to the semiconductor device 120 through the second transmission line L31 to control the semiconductor device 120. The controller 110 may transmit a command/address signal CA to the semiconductor device 120 through the third transmission line L51 to control the semiconductor device 120. The controller 110 may receive data DATA from the semiconductor device 120 or may transmit the data DATA to the semiconductor device 120, through the fourth transmission line L71.

The controller 110 may output the clock signal CLK, the chip selection signal CS, the command/address signal CA, and the data DATA to the semiconductor device 120 to perform a write operation and an auto-pre-charge operation. The chip selection signal CS and the command/address signal CA may be successively outputted in synchronization with an odd pulse or an even pulse included in the clock signal CLK.

The input control circuit 210 may include a plurality of buffers. The input control circuit 210 may receive the chip selection signal CS and the command/address signal CA from the controller 110 to generate an internal chip selection signal (ICS of FIG. 2) and an internal command/address signal (i.e., first to $K^{th}$ internal command/address signals ICA<1:K> of FIG. 2).

The control signal generation circuit 230 may generate a command power control signal (CMD_PG of FIG. 2), a status power control signal (STT_PG of FIG. 2), an address power control signal (ADD_PG of FIG. 2), and a pre-charge power control signal (PCG_PG of FIG. 2) which are enabled to control the power supply during the write operation and the auto-pre-charge operation. The control signal generation circuit 230 may generate the command power control signal (CMD_PG of FIG. 2), the status power control signal (STT_PG of FIG. 2), the address power control signal (ADD_PG of FIG. 2), and the pre-charge power control signal (PCG_PG of FIG. 2) which are enabled to control the supply of power voltages according to logic levels of the internal chip selection signal (ICS of FIG. 2) and the first to $K^{th}$ internal command/address signals (ICA<1:K> of FIG. 2). The power voltages may include a power source voltage VDD and a ground voltage VSS which are illustrated in FIG. 2.

The control circuit 240 may be driven by the power voltages VDD and VSS while the command power control signal (CMD_PG of FIG. 2), the status power control signal (STT_PG of FIG. 2), the address power control signal (ADD_PG of FIG. 2), and the pre-charge power control signal (PCG_PG of FIG. 2) are enabled. The control circuit 240 may generate a write signal (EWT of FIG. 2), a write pre-charge signal (WTAPG of FIG. 2), a bank address signal including first to $L^{th}$ bank address signals (BA<1:L> of FIG. 2), an internal address signal including first to $M^{th}$ internal address signals (IADD<1:M> of FIG. 2), and an auto-pre-charge address signal including first to $L^{th}$ auto-pre-charge address signals (ABA<1:L> of FIG. 2) while the command power control signal (CMD_PG of FIG. 2), the status power control signal (STT_PG of FIG. 2), the address power control signal (ADD_PG of FIG. 2), and the pre-charge power control signal (PCG_PG of FIG. 2) are enabled.

The memory circuit 260 may store the data DATA during the write operation. The memory circuit 260 may store the data DATA into memory cells which are selected by the write signal (EWT of FIG. 2), the first to $L^{th}$ bank address signals (BA<1:L> of FIG. 2), and the first to $M^{th}$ internal address signals (IADD<1:M> of FIG. 2). The memory circuit 260 may perform the auto-pre-charge operation after the write operation. The memory circuit 260 may perform the auto-pre-charge operation based on the first to $L^{th}$ auto-pre-charge address signals (ABA<1:L> of FIG. 2).

Figure 2:
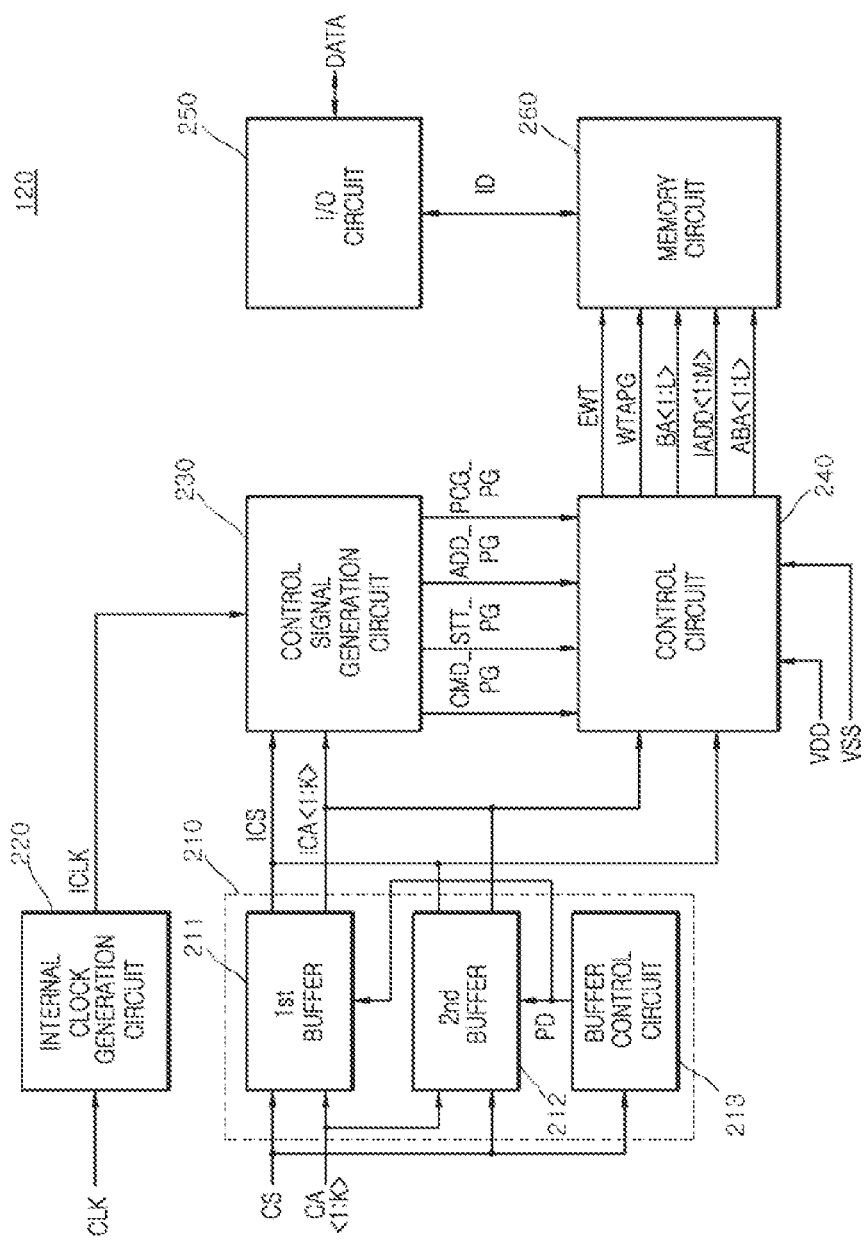
FIG. 2 is a block diagram illustrating a configuration of a semiconductor device included in the electronic device illustrated in FIG. 1.

As illustrated in FIG. 2, the semiconductor device 120 may include the input control circuit 210, an internal clock generation circuit 220, the control signal generation circuit 230, the control circuit 240, an input/output (I/O) circuit 250, and the memory circuit 260.

The input control circuit 210 may include a first buffer 211, a second buffer 212, and a buffer control circuit 213.

The first buffer 211 may be activated by a power-down control signal PD. The first buffer 211 may buffer the chip selection signal CS to generate the internal chip selection signal ICS. The first buffer 211 may buffer the command/ address signal CA including first to $K^{th}$ command/address signals CA<1:K> to generate the first to $K^{th}$ internal command/address signals ICA<1:K>. The first buffer 211 may be realized using a CMOS buffer which is activated when the power-down control signal PD is enabled. The first buffer 211 may be activated during a power-down operation.

The second buffer 212 may be activated by the power-down control signal PD. The second buffer 212 may buffer the chip selection signal CS to generate the internal chip selection signal ICS. The second buffer 212 may buffer the first to $K^{th}$ command/address signals CA<1:K> to generate the first to $K^{th}$ internal command/address signals ICA<1:K>. The second buffer 212 may be realized using a differential amplification buffer which is activated when the power-down control signal PD is disabled. The second buffer 212 may be activated during the write operation, a read operation, and the auto-pre-charge operation which are performed after the power-down operation.

The buffer control circuit 213 may generate the power-down control signal PD for activating one of the first and second buffers 211 and 212 according to whether the power-down operation is performed. The buffer control circuit 213 may generate the power-down control signal PD which is enabled when the power-down operation commences. The buffer control circuit 213 may generate the power-down control signal PD which is disabled when the chip selection signal CS is inputted to the buffer control circuit 213 after the power-down operation commences. A logic level of the power-down control signal PD which is enabled may be set as a logic "low" level or a logic "high" level according to embodiment.

The input control circuit 210 may activate the first buffer 211 realized using a CMOS buffer during the power-down operation. The input control circuit 210 may buffer the chip selection signal CS and the first to $K^{th}$ command/address signals CA<1:K> using the first buffer 211 to generate the internal chip selection signal ICS and the first to $K^{th}$ internal command/address signals ICA<1:K> during the power-down operation. The input control circuit 210 may activate the second buffer 212 realized using a differential amplification buffer when the power-down operation terminates. The input control circuit 210 may buffer the chip selection signal CS and the first to $K^{th}$ command/address signals CA<1:K> using the second buffer 212 to generate the internal chip selection signal ICS and the first to $K^{th}$ internal command/address signals ICA<1:K> when the power-down operation terminates.

The internal clock generation circuit 220 may receive the clock signal CLK to generate an internal clock signal ICLK. The internal clock generation circuit 220 may generate the internal clock signal ICLK having a frequency which is twice the frequency of the clock signal CLK. Frequencies and toggling cycles of the clock signal CLK and the internal clock signal ICLK may be set to be different according to embodiment.

The control signal generation circuit 230 may generate the command power control signal CMD_PG, the status power control signal STT_PG, the address power control signal ADD_PG, and the pre-charge power control signal PCG_PG which are enabled to control the supply of the power voltages during the write operation and the auto-pre-charge operation. The control signal generation circuit 230 may generate the command power control signal CMD_PG, the status power control signal STT_PG, the address power control signal ADD_PG, and the pre-charge power control signal PCG_PG which are enabled to control the supply of the power voltages when the internal chip selection signal ICS and the first to $K^{th}$ internal command/address signals ICA<1:K> have a logic level combination for performing the write operation. The control signal generation circuit 230 may generate the command power control signal CMD_PG, the status power control signal STT_PG, the address power control signal ADD_PG, and the pre-charge power control signal PCG_PG which are enabled to control the supply of the power voltages when the internal chip selection signal ICS and the first to $K^{th}$ internal command/address signals ICA<1:K> have a logic level combination for performing the auto-pre-charge operation.

The control circuit 240 may be driven by the power source voltage VDD and the ground voltage VSS while the command power control signal CMD_PG, the status power control signal STT_PG, the address power control signal ADD_PG, and the pre-charge power control signal PCG_PG are enabled. The control circuit 240 may generate the write signal EWT, the first to $L^{th}$ bank address signals BA<1:L>, and the first to $M^{th}$ internal address signals IADD<1:M> based on the internal chip selection signal ICS and the first to $K^{th}$ internal command/address signals ICA<1:K> while the command power control signal CMD_PG, the status power control signal STT_PG, and the address power control signal ADD_PG are enabled during the write operation. The control circuit 240 may generate the write signal EWT, the write pre-charge signal WTAPG, the first to LY bank address signals BA<1:L>, the first to $M^{th}$ internal address signals IADD<1:M>, and the first to $L^{th}$ auto-pre-charge address signals ABA<1:L> based on the internal chip selection signal ICS and the first to $K^{th}$ internal command/address signals ICA<1:K> while the command power control signal CMD_PG, the status power control signal STT_PG, and the address power control signal ADD_PG, and the pre-charge power control signal PCG_PG are enabled during the auto-pre-charge operation. The control circuit 240 may generate the first to $L^{th}$ auto-pre-charge address signals ABA<1:L> from the first to $L^{th}$ bank address signals BA<1:L> after generating the write signal EWT, the write pre-charge signal WTAPG, the first to $L^{th}$ bank address signals BA<1:L>, and the first to $M^{th}$ internal address signals IADD<1:M> based on the internal chip selection signal ICS and the first to $K^{th}$ internal command/address signals ICA<1:K> during the auto-pre-charge operation.

The I/O circuit 250 may buffer the data DATA outputted from the controller 110 to generate internal data ID during the write operation. The I/O circuit 250 may buffer the data DATA outputted from the controller 110 to generate the internal data ID during the auto-pre-charge operation. The I/O circuit 250 may buffer the internal data ID to generate the data DATA during the read operation.

The memory circuit 260 may store the internal data ID during the write operation. The memory circuit 260 may store the internal data ID into memory cells which are selected by the write signal EWT, the first to $L^{th}$ bank address signals BA<1:L>, and the first to $M^{th}$ internal address signals IADD<1:M>. The memory circuit 260 may perform the auto-pre-charge operation after the write operation. The memory circuit 260 may perform the auto-pre-charge operation based on the write pre-charge signal WTAPG and the first to $L^{th}$ auto-pre-charge address signals ABA<1:L>. The memory circuit 260 may output the internal data ID stored therein during the read operation.

Figure 3:
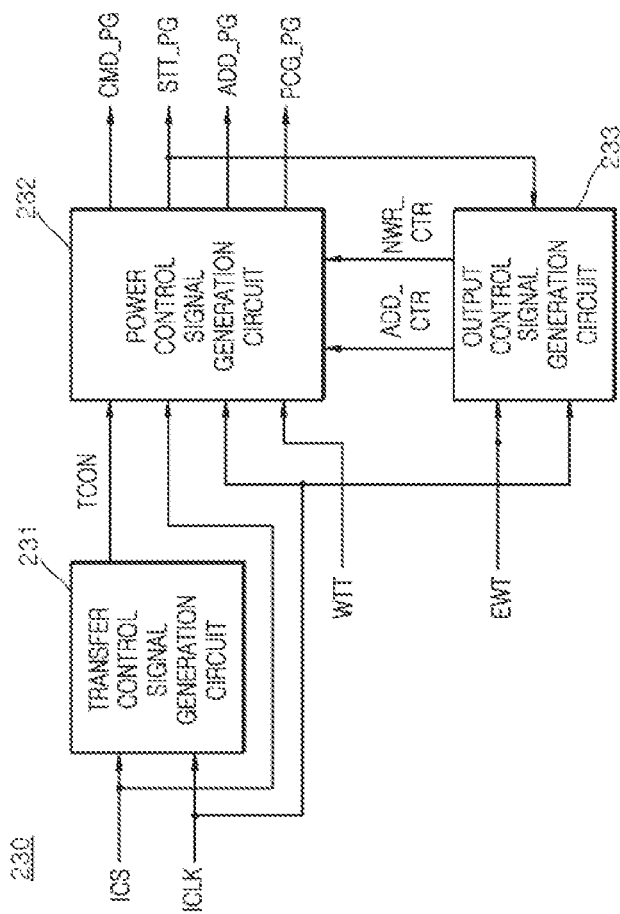
FIG. 3 is a block diagram illustrating a configuration of a control signal generation circuit included in the semiconductor device illustrated in FIG. 2.

As illustrated in FIG. 3, the control signal generation circuit 230 may include a transfer control signal generation circuit 231, a power control signal generation circuit 232, and an output control signal generation circuit 233.

The transfer control signal generation circuit 231 may be synchronized with the internal clock signal ICLK to latch the internal chip selection signal ICS. The transfer control signal generation circuit 231 may shift the latched signal of the internal chip selection signal ICS to generate a transfer control signal TCON. The transfer control signal generation circuit 231 may generate the transfer control signal TCON based on the internal chip selection signal ICS while a pulse of the internal clock signal ICLK is inputted to the transfer control signal generation circuit 231.

The power control signal generation circuit 232 may be synchronized with the internal clock signal ICLK to generate the command power control signal CMD_PG based on the internal chip selection signal ICS. The power control signal generation circuit 232 may adjust a pulse width of the internal chip selection signal ICS in synchronization with the internal clock signal ICLK to generate the command power control signal CMD_PG. The power control signal generation circuit 232 may generate the status power control signal STT_PG based on the internal chip selection signal ICS and a recovery output control signal NWR_CTR. The power control signal generation circuit 232 may generate the status power control signal STT_PG which is enabled at a point in time when the internal chip selection signal ICS is inputted to the power control signal generation circuit 232. The power control signal generation circuit 232 may generate the status power control signal STT_PG which is disabled at a point in time when the recovery output control signal NWR_CTR is inputted to the power control signal generation circuit 232. The power control signal generation circuit 232 may generate the address power control signal ADD_PG based on the internal chip selection signal ICS and an address output control signal ADD_CTR. The power control signal generation circuit 232 may generate the address power control signal ADD_PG which is enabled at a point in time when the internal chip selection signal ICS is inputted to the power control signal generation circuit 232. The power control signal generation circuit 232 may generate the address power control signal ADD_PG which is disabled at a point in time when the address output control signal ADD_CTR is inputted to the power control signal generation circuit 232. The power control signal generation circuit 232 may generate the pre-charge power control signal PCG_PG based on a write output control signal WTT and the recovery output control signal NWR_CTR. The pre-charge power control signal PCG_PG is enabled after a set period elapses from a point in time when the internal chip selection signal ICS is inputted to the control signal generation circuit 232. The set period is set as a period from a point in time when the internal chip selection signal ICS is generated until a point in time when a write output control signal WTT is generated by shifting the write signal EWT generated during the write operation.

The output control signal generation circuit 233 may be synchronized with the internal clock signal ICLK to generate the address output control signal ADD_CTR and the recovery output control signal NWR_CTR based on the write signal EWT and the status power control signal STT_PG. The output control signal generation circuit 233 may shift the write signal EWT in synchronization with the internal clock signal ICLK to generate the address output control signal ADD_CTR. The output control signal generation circuit 233 may shift the address output control signal ADD_CTR in synchronization with the internal clock signal ICLK to generate the recovery output control signal NWR_CTR.

Figure 4:
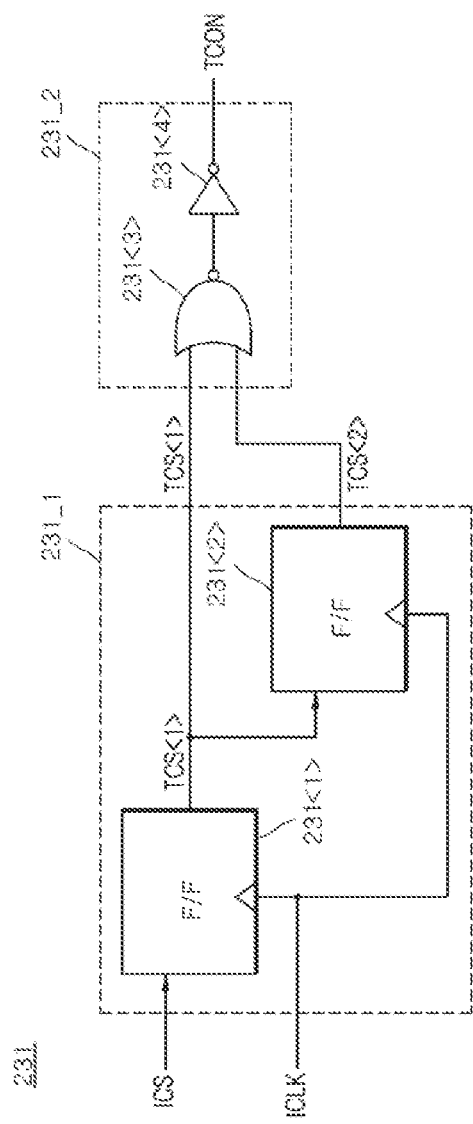
FIG. 4 illustrates a configuration of a transfer control signal generation circuit included in the control signal generation circuit illustrated in FIG. 3.

As illustrated in FIG. 4, the transfer control signal generation circuit 231 may include a transfer shift signal generation circuit 231_1 and a signal synthesis circuit 231_2.

The transfer shift signal generation circuit 231_1 may be realized using flip-flops 231<1> and 231<2>. The flip-flop 231<1> may be synchronized with the internal clock signal ICLK to latch the internal chip selection signal ICS. The flip-flop 231<1> may output the latched signal of the internal chip selection signal ICS as a first transfer shift signal TCS<1>. The flip-flop 231<2> may be synchronized with the internal clock signal ICLK to latch the first transfer shift signal TCS<1>. The flip-flop 231<2> may output the latched signal of the first transfer shift signal TCS<1> as a second transfer shift signal TCS<2>.

The transfer shift signal generation circuit 231_1 may generate the second transfer shift signal TCS<2> after the first transfer shift signal TCS<1> is generated by shifting the internal chip selection signal ICS.

The signal synthesis circuit 231_2 may be realized using a NOR gate 231<3> and an inverter 231<4> which are coupled in series. The signal synthesis circuit 231_2 may perform a logical OR operation of the first transfer shift signal TCS<1> and the second transfer shift signal TCS<2> to generate the transfer control signal TCON. The signal synthesis circuit 231_2 may generate the transfer control signal TCON which is enabled to have a logic "high" level when any one of the first transfer shift signal TCS<1> and the second transfer shift signal TCS<2> has a logic "high" level.

Figure 5:
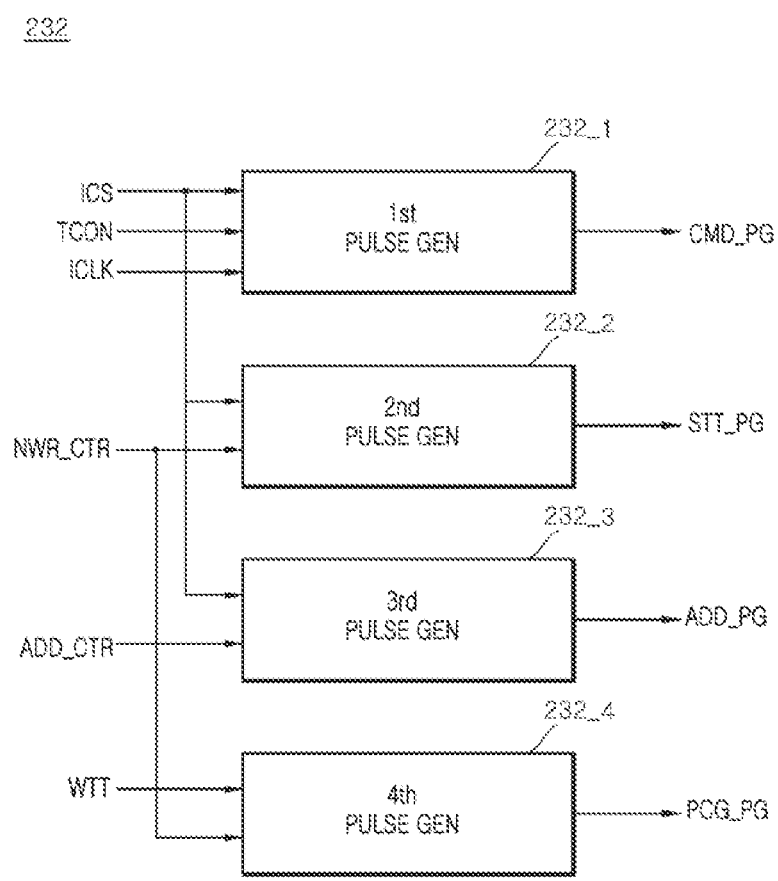
FIG. 5 is a block diagram illustrating a configuration of a power control signal generation circuit included in the control signal generation circuit illustrated in FIG. 3.

As illustrated in FIG. 5, the power control signal generation circuit 232 may include a first pulse generation circuit 232_1, a second pulse generation circuit 2322, a third pulse generation circuit 232_3, and a fourth pulse generation circuit 232_4.

The first pulse generation circuit 232_1 may be synchronized with the internal clock signal ICLK to generate the command power control signal CMD_PG including a pulse which is generated based on the internal chip selection signal ICS and the transfer control signal TCON. The first pulse generation circuit 232_1 may be synchronized with the internal clock signal ICLK to generate the command power control signal CMD_PG, a pulse width of which is adjusted by the internal chip selection signal ICS and the transfer control signal TCON.

The second pulse generation circuit 232_2 may generate the status power control signal STT_PG including a pulse which is generated based on the internal chip selection signal ICS and the recovery output control signal NWR_CTR. The second pulse generation circuit 232_2 may generate the status power control signal STT_PG which is enabled at a point in time when the internal chip selection signal ICS is inputted to the second pulse generation circuit 232_2. The second pulse generation circuit 232_2 may generate the status power control signal STT_PG which is disabled at a point in time when the recovery output control signal NWR_CTR is inputted to the second pulse generation circuit 232_2.

The third pulse generation circuit 232_3 may generate the address power control signal ADD_PG including a pulse which is generated based on the internal chip selection signal ICS and the address output control signal ADD_CTR. The third pulse generation circuit 232_3 may generate the address power control signal ADD_PG which is enabled at a point in time when the internal chip selection signal ICS is inputted to the third pulse generation circuit 232_3. The third pulse generation circuit 232_3 may generate the address power control signal ADD_PG which is disabled at a point in time when the address output control signal ADD_CTR is inputted to the third pulse generation circuit 232_3.

The fourth pulse generation circuit 232_4 may generate the pre-charge power control signal PCG_PG including a pulse which is generated based on the write output control signal WTT and the recovery output control signal NWR_CTR. The fourth pulse generation circuit 232_4 may generate the pre-charge power control signal PCG_PG which is enabled at a point in time when the write output control signal WTT is inputted to the fourth pulse generation circuit 232_4. The fourth pulse generation circuit 232_4 may generate the pre-charge power control signal PCG_PG which is disabled at a point in time when the recovery output control signal NWR_CTR is inputted to the fourth pulse generation circuit 232_4.

Figure 6:
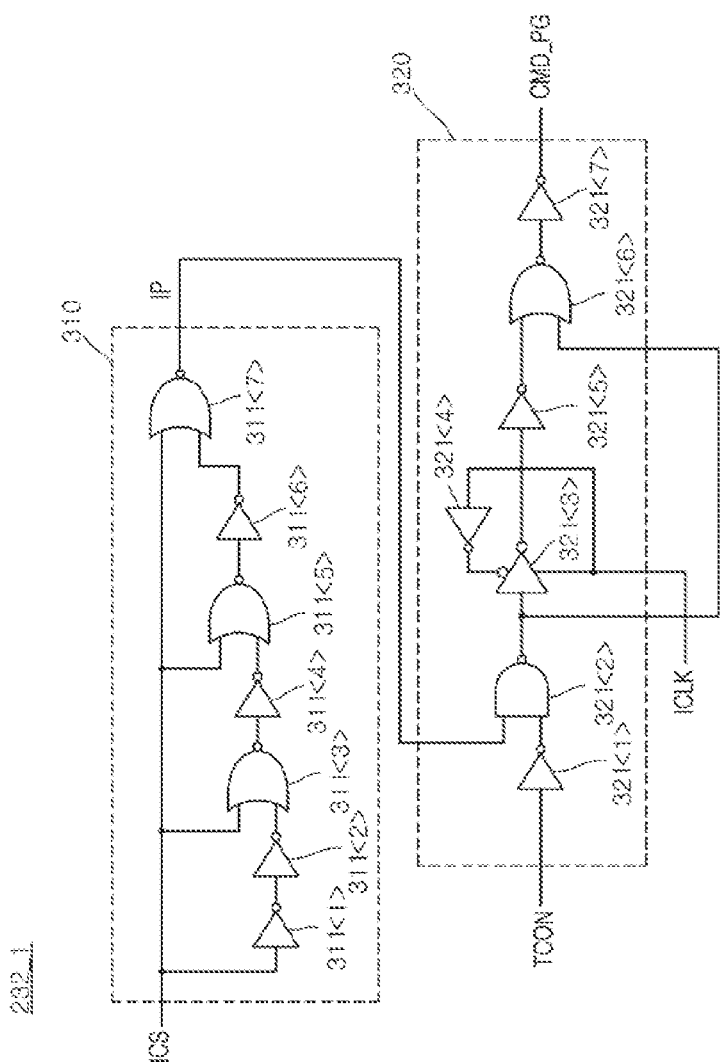
FIG. 6 is a circuit diagram illustrating a configuration of a first pulse generation circuit included in the power control signal generation circuit illustrated in FIG. 5.

As illustrated in FIG. 6, the first pulse generation circuit 232_1 may include an internal pulse generation circuit 310 and a signal transfer circuit 320.

The internal pulse generation circuit 310 may be realized using inverters 311<1>, 311<2>, 311<4>, and 311<6> and NOR gates 311<3>, 311<5>, and 311<7>. The internal pulse generation circuit 310 may generate an internal pulse IP which is enabled during a predetermined period from a point in time when the internal chip selection signal ICS is inputted to the internal pulse generation circuit 310. The internal pulse generation circuit 310 may generate the internal pulse IP having a logic "low" level during the predetermined period from a point in time when the internal chip selection signal ICS having a logic "high" level is inputted to the internal pulse generation circuit 310.

The signal transfer circuit 320 may be realized using inverters 321<1>, 321<3>, 321<4>, 321<5>, and 321<7>; a NAND gate 321<2>; and a NOR gate 321<6>. The signal transfer circuit 320 may be synchronized with the internal clock signal ICLK to generate the command power control signal CMD_PG based on the internal pulse IP and the transfer control signal TCON. The signal transfer circuit 320 may generate the command power control signal CMD_PG which is enabled to have a logic "high" level when the internal pulse IP has a logic "low" level at a point in time when the internal clock signal ICLK having a logic "high" level is inputted to the signal transfer circuit 320. The signal transfer circuit 320 may generate the command power control signal CMD_PG which is disabled to have a logic "low" level when the transfer control signal TCON has a logic "low" level at a point in time when the internal clock signal ICLK having a logic "high" level is inputted to the signal transfer circuit 320.

Figure 7:
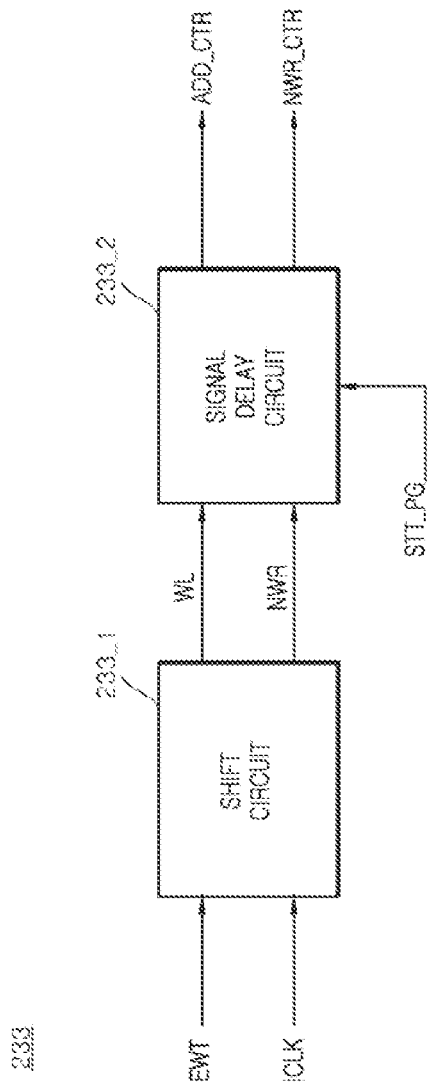
FIG. 7 is a block diagram illustrating a configuration of an output control signal generation circuit included in the control signal generation circuit illustrated in FIG. 3.

As illustrated in FIG. 7, the output control signal generation circuit 233 may include a shift circuit 233_1 and a signal delay circuit 233_2.

The shift circuit 233_1 may generate a recovery signal NWR after generating a latency signal WL by shifting the write signal EWT in synchronization with the internal clock signal ICLK. The shift circuit 233_1 may shift the write signal EWT by a first period in synchronization with the internal clock signal ICLK to generate the latency signal WL. The shift circuit 233_1 may shift the latency signal WL by a second period in synchronization with the internal clock signal ICLK to generate the recovery signal NWR. The first period may be set as a write latency period. The second period may be set as a write recovery period. The first period may be set to be different according to embodiment, and the second period may also be set to be different according to embodiment.

The signal delay circuit 233_2 may be synchronized with the latency signal WL and the recovery signal NWR to generate the address output control signal ADD_CTR and the recovery output control signal NWR_CTR based on the status power control signal STT_PG. The signal delay circuit 233_2 may generate the address output control signal ADD_CTR based on the status power control signal STT_PG at a point in time when the latency signal WL is inputted to the signal delay circuit 233_2. The signal delay circuit 233_2 may generate the recovery output control signal NWR_CTR based on the status power control signal STT_PG at a point in time when the recovery signal NWR is inputted to the signal delay circuit 233_2.

Figure 8:
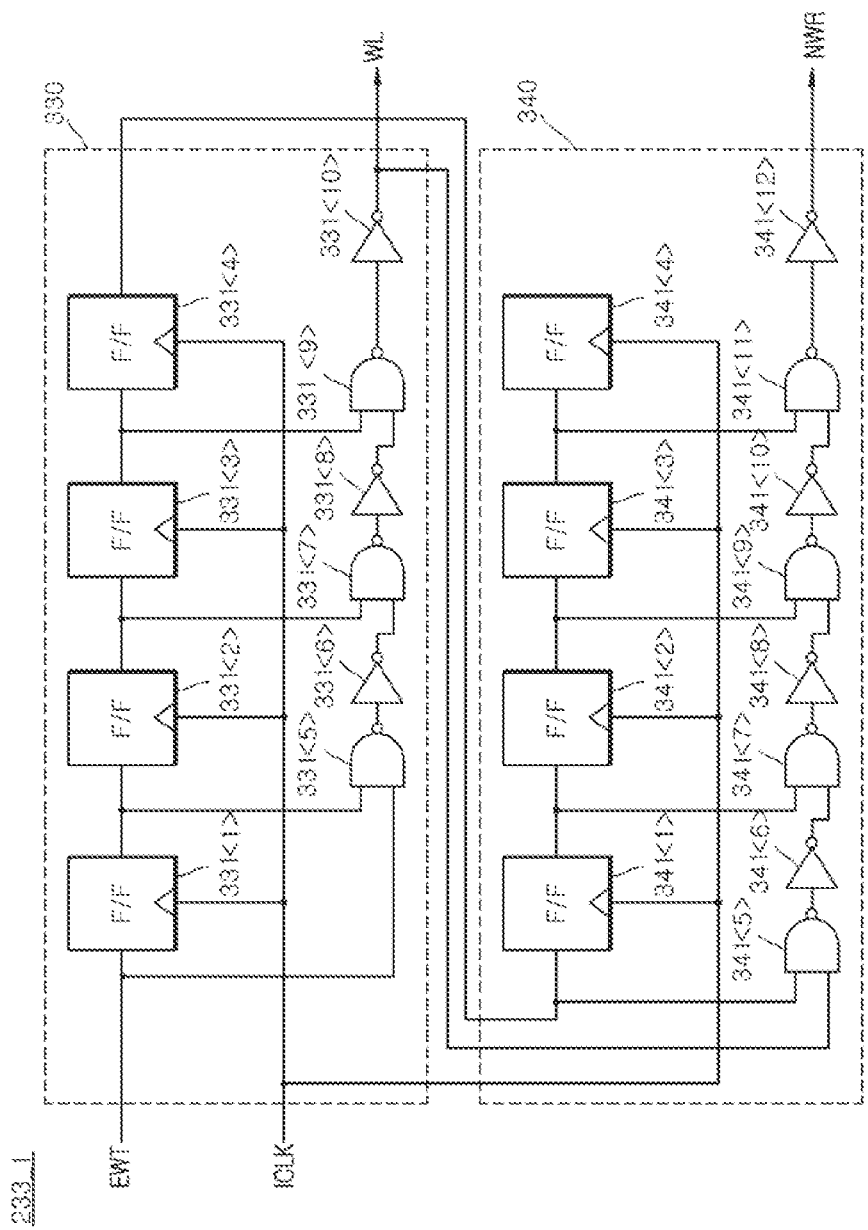
FIG. 8 illustrates a configuration of a shift circuit included in the output control signal generation circuit illustrated in FIG. 7.

As illustrated in FIG. 8, the shift circuit 233_1 may include a first shift circuit 330 and a second shift circuit 340.

The first shift circuit 330 may be realized using flip-flops 331<1>, 331<2>, 331<3>, and 331<4>; NAND gates 331<5>, 331<7>, and 331<9>; and inverters 331<6>, 331<8>, and 331<10>. The first shift circuit 330 may shift the write signal EWT by the first period in synchronization with the internal clock ICLK to generate the latency signal WL. Although the first shift circuit 330 is illustrated to generate the latency signal WL by shifting the write signal EWT by the first period using the three flip-flops 331<1>, 331<2>, and 331<3>, the number of the flip-flops used for shifting the write signal EWT by the write latency period to generate the latency signal WL may be set to be different according to embodiment.

The second shift circuit 340 may be realized using flip-flops 341<1>, 341<2>, 341<3>, and 341<4>; NAND gates 341<5>, 341<7>, 341<9>, and 341<11>; and inverters 341<6>, 341<8>, 341<10>, and 341<12>. The second shift circuit 340 may shift the latency signal WL by the second period in synchronization with the internal clock ICLK to generate the recovery signal NWR. Although the second shift circuit 340 is illustrated to generate the recovery signal NWR by shifting the latency signal WL by the second period using the three flip-flops 341<1>, 341<2>, and 341<3>, the number of the flip-flops used for shifting the latency signal WL by the write recovery period to generate the recovery signal NWR may be set to be different according to embodiment.

Figure 9:
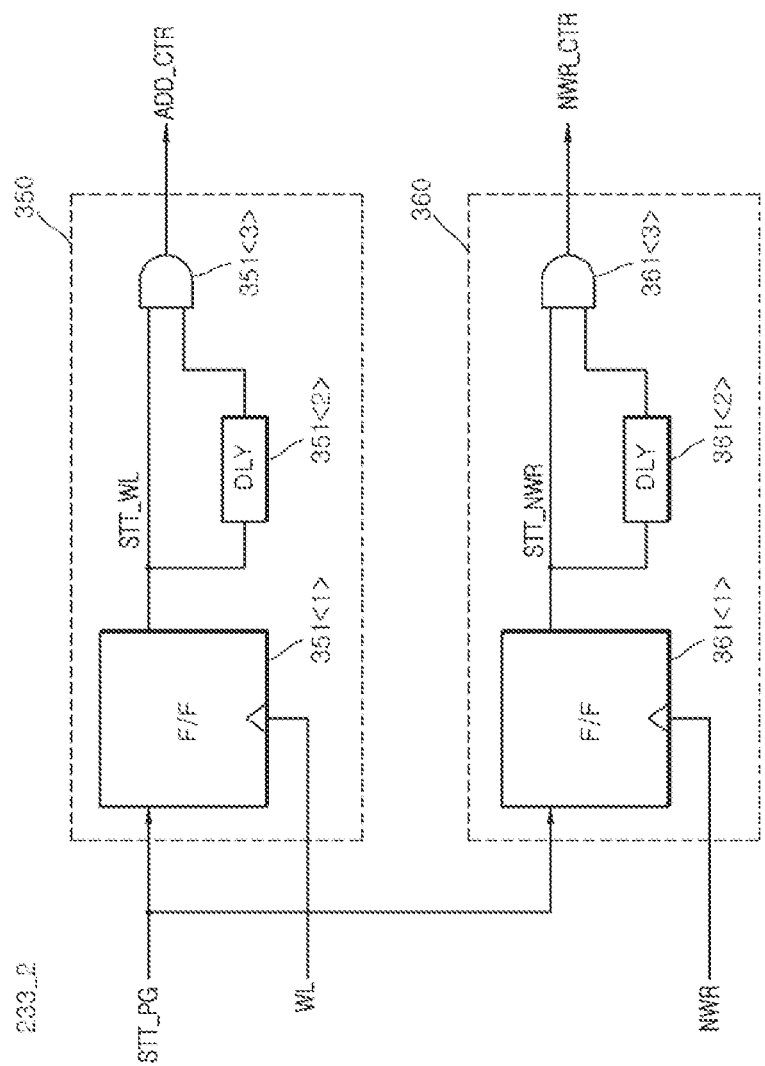
FIG. 9 illustrates a configuration of a signal delay circuit included in the output control signal generation circuit illustrated in FIG. 7.

As illustrated in FIG. 9, the signal delay circuit 233_2 may include a first latch circuit 350 and a second latch circuit 360.

The first latch circuit 350 may be realized using a flip-flop 351<1>, a delay circuit 351<2>, and an AND gate 351<3>. The flip-flop 351<1> may be synchronized with the latency signal WL to latch the status power control signal STT_PG. The flip-flop 351<1> may output the latched signal of the status power control signal STT_PG as a status latency signal STT_WL. The delay circuit 351<2> may inversely delay the status latency signal STT_WL to output the inversely delayed signal of the status latency signal STT_WL. The AND gate 351<3> may perform a logical AND operation of the status latency signal STT_WL and an output signal of the delay circuit 351<2> to generate the address output control signal ADD_CTR.

The second latch circuit 360 may be realized using a flip-flop 361<1>, a delay circuit 361<2>, and an AND gate 361<3>. The flip-flop 361<1> may be synchronized with the recovery signal NWR to latch the status power control signal STT_PG. The flip-flop 361<1> may output the latched signal of the status power control signal STT_PG as a status recovery signal STT_NWR. The delay circuit 361<2> may inversely delay the status recovery signal STT_NWR to output the inversely delayed signal of the status recovery signal STT_NWR. The AND gate 361<3> may perform a logical AND operation of the status recovery signal STT_NWR and an output signal of the delay circuit 361<2> to generate the recovery output control signal NWR_CTR.

Figure 10:
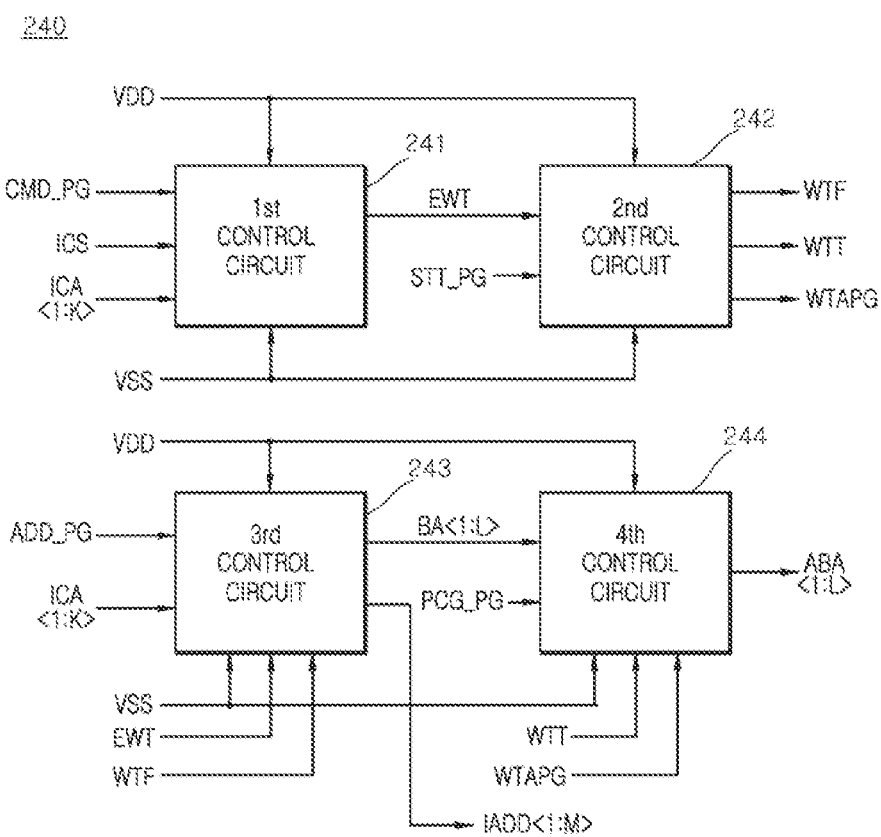
FIG. 10 is a block diagram illustrating a configuration of a control circuit included in the semiconductor device illustrated in FIG. 2.

As illustrated in FIG. 10, the control circuit 240 may include a first control circuit 241, a second control circuit 242, a third control circuit 243, and a fourth control circuit 244.

The first control circuit 241 may be driven by the power source voltage VDD and the ground voltage VSS and may generate the write signal EWT based on the internal chip selection signal ICS and the first to $K^{th}$ internal command/address signals ICA<1:K>, while the command power control signal CMD_PG is enabled. The first control circuit 241 may generate the write signal EWT which is enabled when the internal chip selection signal ICS and the first to $K^{th}$ internal command/address signals ICA<1:K> have a logic level combination for performing the write operation and the auto-pre-charge operation while the command power control signal CMD_PG is enabled.

The second control circuit 242 may be driven by the power source voltage VDD and the ground voltage VSS and may generate a write flag signal WTF, the write output control signal WTT, and the write pre-charge signal WTAPG which are sequentially enabled based on the write signal EWT, while the status power control signal STT_PG is enabled. The second control circuit 242 may generate the write flag signal WTF, the write output control signal WTT, and the write pre-charge signal WTAPG which are sequentially enabled when the write signal EWT is inputted to the second control circuit 242 while the status power control signal STT_PG is enabled.

The third control circuit 243 may be driven by the power source voltage VDD and the ground voltage VSS and may generate the first to $L^{th}$ bank address signals BA<1:L> and the first to $M^{th}$ internal address signals IADD<1:M> based on the write signal EWT, the write flag signal WTF, and the first to $K^{th}$ internal command/address signals ICA<1:K>, while the address power control signal ADD_PG is enabled. The third control circuit 243 may latch the first to $K^{th}$ internal command/address signals ICA<1:K> when the write signal EWT is inputted to the third control circuit 243 while the address power control signal ADD_PG is enabled. The third control circuit 243 may generate the first to $L^{th}$ bank address signals BA<1:L> and the first to $M^{th}$ internal address signals IADD<1:M> based on the latched signals of the first to $K^{th}$ internal command/address signals ICA<1:K> when the write flag signal WTF is inputted to the third control circuit 243 while the address power control signal ADD_PG is enabled.

The fourth control circuit 244 may be driven by the power source voltage VDD and the ground voltage VSS and may generate the first to $L^{th}$ auto-pre-charge address signals ABA<1:L> from the first to $L^{th}$ bank address signals BA<1:L> based on the write output control signal WTT and the write pre-charge signal WTAPG, while the pre-charge power control signal PCG_PG is enabled. The fourth control circuit 244 may latch the first to $L^{th}$ bank address signals BA<1:L> when the write output control signal WTT is inputted to the fourth control circuit 244 while the pre-charge power control signal PCG_PG is enabled. The fourth control circuit 244 may generate the first to $L^{th}$ auto-pre-charge address signals ABA<1:L> based on the latched signals of the first to $L^{th}$ bank address signals BA<1:L> when the write pre-charge signal WTAPG is inputted to the fourth control circuit 244 while the pre-charge power control signal PCG_PG is enabled.

Figure 11:
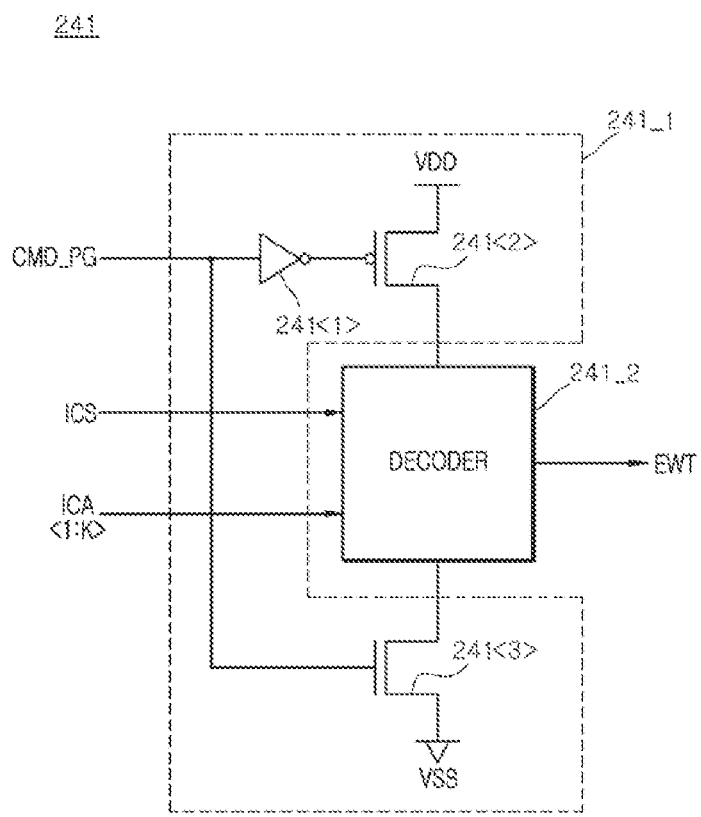
FIG. 11 illustrates a configuration of a first control circuit included in the control circuit illustrated in FIG. 10.

As illustrated in FIG. 11, the first control circuit 241 may include a first power supply circuit 241_1 and a decoder 241_2.

The first power supply circuit 241_1 may be realized using an inverter 241<1>, a PMOS transistor 241<2>, and an NMOS transistor 241<3>. The inverter 241<1> may inversely buffer the command power control signal CMD_PG to output the inversely buffered signal of the command power control signal CMD_PG. The PMOS transistor 241<2> may be coupled between a supply terminal of the power source voltage VDD and the decoder 241_2. The PMOS transistor 241<2> may be turned on to supply the power source voltage VDD to the decoder 241_2 when an output signal of the inverter 241<1> has a logic "low" level. The PMOS transistor 241<2> may be turned off to inhibit the power source voltage VDD from being supplied to the decoder 241_2 when an output signal of the inverter 241<1> has a logic "high" level. The NMOS transistor 241<3> may be coupled between the decoder 241_2 and a supply terminal of the ground voltage VSS. The NMOS transistor 241<3> may be turned on to supply the ground voltage VSS to the decoder 241_2 when the command power control signal CMD_PG has a logic "high" level. The NMOS transistor 241<3> may be turned off to inhibit the ground voltage VSS from being supplied to the decoder 241_2 when the command power control signal CMD_PG has a logic "low" level.

The first power supply circuit 241_1 may supply the power source voltage VDD and the ground voltage VSS to the decoder 241_2 while the command power control signal CMD_PG is enabled to have a logic "high" level.

The decoder 241_2 may be driven to generate the write signal EWT based on the internal chip selection signal ICS and the first to $K^{th}$ internal command/address signals ICA<1:K> while the power source voltage VDD and the ground voltage VSS are supplied to the decoder 241_2. The decoder 241_2 may decode the internal chip selection signal ICS and the first to $K^{th}$ internal command/address signals ICA<1:K> to generate the write signal EWT while the power source voltage VDD and the ground voltage VSS are supplied to the decoder 241_2. The decoder 241_2 may be driven by the power source voltage VDD and the ground voltage VSS to generate the write signal EWT which is enabled when the internal chip selection signal ICS and the first to $K^{th}$ internal command/address signals ICA<1:K> have a logic level combination for performing the write operation and the auto-pre-charge operation.

Figure 12:
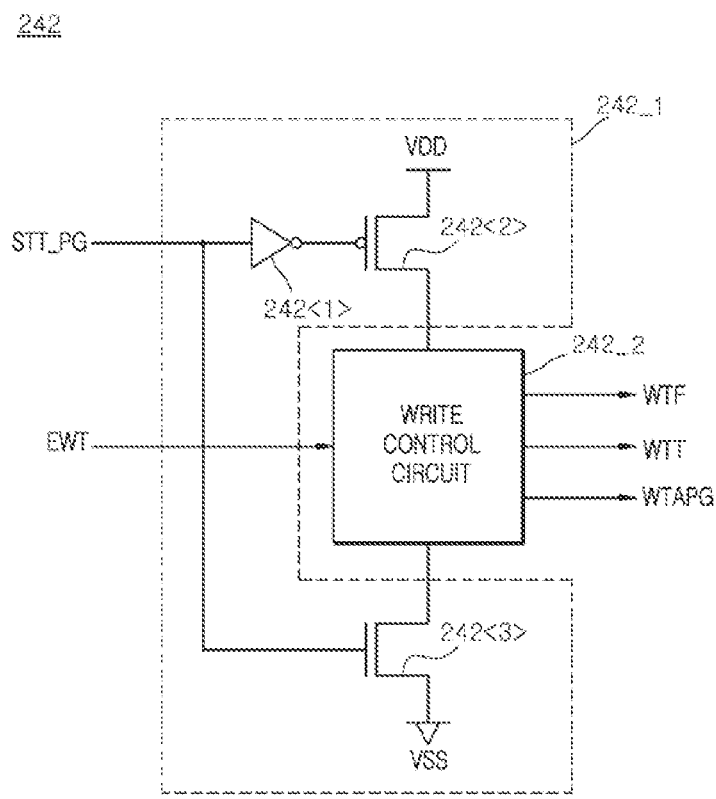
FIG. 12 illustrates a configuration of a second control circuit included in the control circuit illustrated in FIG. 10.

As illustrated in FIG. 12, the second control circuit 242 may include a second power supply circuit 242_1 and a write control circuit 242_2.

The second power supply circuit 242_1 may be realized using an inverter 242<1>, a PMOS transistor 242<2>, and an NMOS transistor 242<3>. The inverter 242<1> may inversely buffer the status power control signal STT_PG to output the inversely buffered signal of the status power control signal STT_PG. The PMOS transistor 242<2> may be coupled between the supply terminal of the power source voltage VDD and the write control circuit 242_2. The PMOS transistor 242<2> may be turned on to supply the power source voltage VDD to the write control circuit 242_2 when an output signal of the inverter 242<1> has a logic "low" level. The PMOS transistor 242<2> may be turned off to inhibit the power source voltage VDD from being supplied to the write control circuit 242_2 when an output signal of the inverter 242<1> has a logic "high" level. The NMOS transistor 242<3> may be coupled between the write control circuit 242_2 and the supply terminal of the ground voltage VSS. The NMOS transistor 242<3> may be turned on to supply the ground voltage VSS to the write control circuit 242_2 when the status power control signal STT_PG has a logic "high" level. The NMOS transistor 242<3> may be turned off to inhibit the ground voltage VSS from being supplied to the write control circuit 242_2 when the status power control signal STT_PG has a logic "low" level.

The second power supply circuit 242_1 may supply the power source voltage VDD and the ground voltage VSS to the write control circuit 242_2 while the status power control signal STT_PG is enabled to have a logic "high" level.

The write control circuit 2422 may be driven by the power source voltage VDD and the ground voltage VSS to generate the write flag signal WTF, the write output control signal WTT, and the write pre-charge signal WTAPG, which are sequentially enabled, based on the write signal EWT. The write control circuit 242_2 may be driven by the power source voltage VDD and the ground voltage VSS to generate the write flag signal WTF, the write output control signal WTT, and the write pre-charge signal WTAPG which are sequentially enabled by shifting the write signal EWT.

Figure 13:
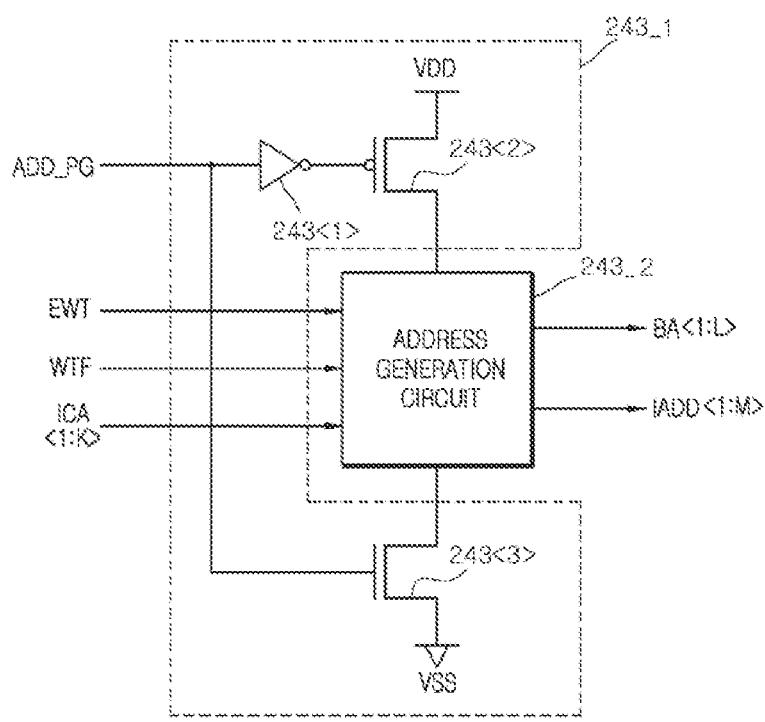
FIG. 13 illustrates a configuration of a third control circuit included in the control circuit illustrated in FIG. 10.

As illustrated in FIG. 13, the third control circuit 243 may include a third power supply circuit 243_1 and an address generation circuit 243_2.

The third power supply circuit 243_1 may be realized using an inverter 243<1>, a PMOS transistor 243<2>, and an NMOS transistor 243<3>. The inverter 243<1> may inversely buffer the address power control signal ADD_PG to output the inversely buffered signal of the address power control signal ADD_PG. The PMOS transistor 243<2> may be coupled between the supply terminal of the power source voltage VDD and the address generation circuit 243_2. The PMOS transistor 243<2> may be turned on to supply the power source voltage VDD to the address generation circuit 243_2 when an output signal of the inverter 243<1> has a logic "low" level. The PMOS transistor 243<2> may be turned off to inhibit the power source voltage VDD from being supplied to the address generation circuit 243_2 when an output signal of the inverter 243<1> has a logic "high" level. The NMOS transistor 243<3> may be coupled between the address generation circuit 243_2 and the supply terminal of the ground voltage VSS. The NMOS transistor 243<3> may be turned on to supply the ground voltage VSS to the address generation circuit 243_2 when the address power control signal ADD_PG has a logic "high" level. The NMOS transistor 243<3> may be turned off to inhibit the ground voltage VSS from being supplied to the address power control signal ADD_PG when the address power control signal ADD_PG has a logic "low" level.

The third power supply circuit 243_1 may supply the power source voltage VDD and the ground voltage VSS to the address generation circuit 243_2 while the address power control signal ADD_PG is enabled to have a logic "high" level.

The address generation circuit 243_2 may be driven by the power source voltage VDD and the ground voltage VSS to generate the first to $L^{th}$ bank address signals BA<1:L> and the first to $M^{th}$ internal address signals IADD<1:M> based on the write signal EWT, the write flag signal WTF, and the first to $K^{th}$ internal command/address signals ICA<1:K>. The address generation circuit 243_2 may be driven by the power source voltage VDD and the ground voltage VSS to generate the first to $L^{th}$ bank address signals BA<1:L> and the first to $M^{th}$ internal address signals IADD<1:M> based on the first to $K^{th}$ internal command/address signals ICA<1:K> by the write signal EWT and the write flag signal WTF. The address generation circuit 243_2 may be driven by the power source voltage VDD and the ground voltage VSS to latch the first to $K^{th}$ internal command/address signals ICA<1:K> when the write signal EWT is inputted to the address generation circuit 243_2. The address generation circuit 243_2 may be driven by the power source voltage VDD and the ground voltage VSS to generate the first to $L^{th}$ bank address signals BA<1:L> and the first to $M^{th}$ internal address signals IADD<1:M> based on the latched signals of the first to $K^{th}$ internal command/address signals ICA<1:K> when the write flag signal WTF is inputted to the address generation circuit 243_2. The first to $L^{th}$ bank address signals BA<1:L> may be generated from a first group of bits included in the first to $K^{th}$ internal command/address signals ICA<1:K>. The first to $M^{th}$ internal address signals IADD<1:M> may be generated from a second group of bits included in the first to $K^{th}$ internal command/address signals ICA<1:K>.

Figure 14:
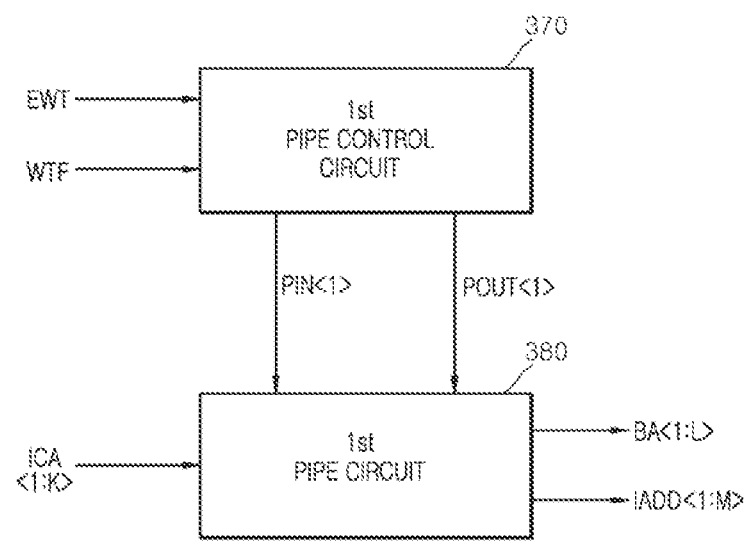
FIG. 14 is a block diagram illustrating a configuration of an address generation circuit included in the third control circuit illustrated in FIG. 13.

As illustrated in FIG. 14, the address generation circuit 2432 may include a first pipe control circuit 370 and a first pipe circuit 380.

The first pipe control circuit 370 may generate a first input control signal PIN<1> and a first output control signal POUT<1> which are sequentially enabled by the write signal EWT and the write flag signal WTF. The first pipe control circuit 370 may generate the first input control signal PIN<1> which is enabled when the write signal EWT is inputted to the first pipe control circuit 370. The first pipe control circuit 370 may generate the first output control signal POUT<1> which is enabled when the write flag signal WTF is inputted to the first pipe control circuit 370.

The first pipe circuit 380 may generate the first to $L^{th}$ bank address signals BA<1:L> and the first to $M^{th}$ internal address signals IADD<1:M> based on the first input control signal PIN<1>, the first output control signal POUT<1>, and the first to $K^{th}$ internal command/address signals ICA<1:K>. The first pipe circuit 380 may latch the first to $K^{th}$ internal command/address signals ICA<1:K> when the first input control signal PIN<1> is inputted to the first pipe circuit 380. The first pipe circuit 380 may generate the first to $L^{th}$ bank address signals BA<1:L> from the first group of bits included in the latched signals of the first to $K^{th}$ internal command/address signals ICA<1:K> when the first output control signal POUT<1> is inputted to the first pipe circuit 380. The first pipe circuit 380 may generate the first to $M^{th}$ internal address signals IADD<1:M> from the second group of bits included in the latched signals of the first to $K^{th}$ internal command/address signals ICA<1:K> when the first output control signal POUT<1> is inputted to the first pipe circuit 380.

Figure 15:
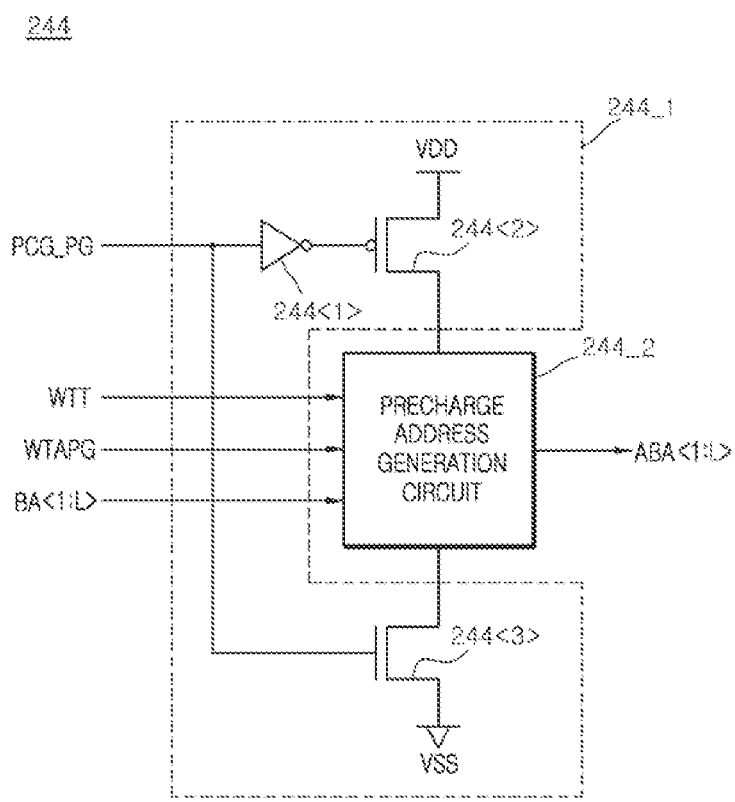
FIG. 15 illustrates a configuration of a fourth control circuit included in the control circuit illustrated in FIG. 10.

As illustrated in FIG. 15, the fourth control circuit 244 may include a fourth power supply circuit 244_1 and a pre-charge address generation circuit 244_2.

The fourth power supply circuit 244_1 may be realized using an inverter 244<1>, a PMOS transistor 244<2>, and an NMOS transistor 244<3>. The inverter 244<1> may inversely buffer the pre-charge power control signal PCG_PG to output the inversely buffered signal of the pre-charge power control signal PCG_PG. The PMOS transistor 244<2> may be coupled between the supply terminal of the power source voltage VDD and the pre-charge address generation circuit 244_2. The PMOS transistor 244<2> may be turned on to supply the power source voltage VDD to the pre-charge address generation circuit 244_2 when an output signal of the inverter 244<1> has a logic "low" level. The PMOS transistor 244<2> may be turned off to inhibit the power source voltage VDD from being supplied to the pre-charge address generation circuit 244_2 when an output signal of the inverter 244<1> has a logic "high" level. The NMOS transistor 244<3> may be coupled between the pre-charge address generation circuit 244_2 and the supply terminal of the ground voltage VSS. The NMOS transistor 244<3> may be turned on to supply the ground voltage VSS to the pre-charge address generation circuit 244_2 when the pre-charge power control signal PCG_PG has a logic "high" level. The NMOS transistor 244<3> may be turned off to inhibit the ground voltage VSS from being supplied to the pre-charge power control signal PCG_PG when the address power control signal ADD_PG has a logic "low" level.

The fourth power supply circuit 244_1 may supply the power source voltage VDD and the ground voltage VSS to the pre-charge address generation circuit 244_2 while the pre-charge power control signal PCG_PG is enabled to have a logic "high" level.

The pre-charge address generation circuit 244_2 may be driven by the power source voltage VDD and the ground voltage VSS to generate the first to $L^{th}$ auto-pre-charge address signals ABA<1:L> based on the write output control signal WTT, the write pre-charge signal WTAPG, and the first to $L^{th}$ bank address signals BA<1:L>. The pre-charge address generation circuit 244_2 may be driven by the power source voltage VDD and the ground voltage VSS to latch the first to $L^{th}$ bank address signals BA<1:L> when the write output control signal WTT is inputted to the pre-charge address generation circuit 244_2. The pre-charge address generation circuit 2442 may be driven by the power source voltage VDD and the ground voltage VSS to generate the first to $L^{th}$ auto-pre-charge address signals ABA<1:L> based on the latched signals of the first to $L^{th}$ bank address signals BA<1:L> when the write pre-charge signal WTAPG is inputted to the pre-charge address generation circuit 244_2.

Figure 16:
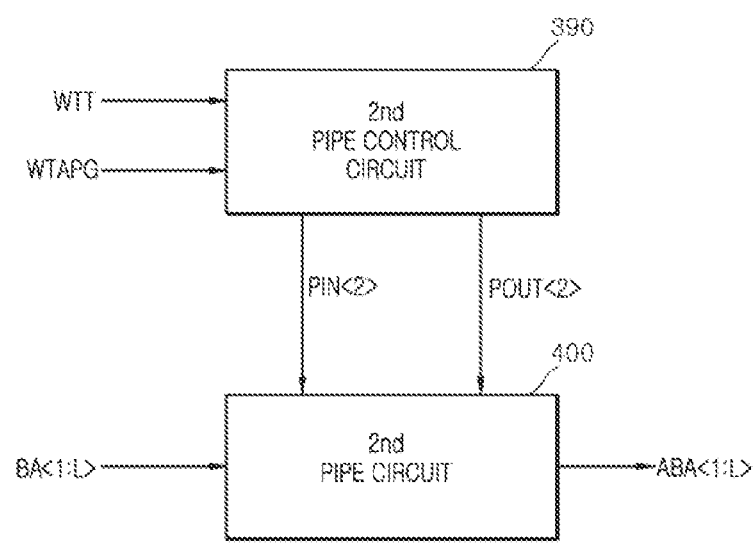
FIG. 16 is a block diagram illustrating a configuration of a pre-charge address generation circuit included in the fourth control circuit illustrated in FIG. 15.

As illustrated in FIG. 16, the pre-charge address generation circuit 244_2 may include a second pipe control circuit 390 and a second pipe circuit 400.

The second pipe control circuit 390 may generate a second input control signal PIN<2> and a second output control signal POUT<2> which are sequentially enabled by the write output control signal WTT and the write pre-charge signal WTAPG. The second pipe control circuit 390 may generate the second input control signal PIN<2> which is enabled when the write output control signal WTT is inputted to the second pipe control circuit 390. The second pipe control circuit 390 may generate the second output control signal POUT<2> which is enabled when the write pre-charge signal WTAPG is inputted to the second pipe control circuit 390.

The second pipe circuit 400 may generate the first to $L^{th}$ auto-pre-charge address signals ABA<1:L> based on the second input control signal PIN<2>, the second output control signal POUT<2>, and the first to $L^{th}$ bank address signals BA<1:L>. The second pipe circuit 400 may latch the first to $L^{th}$ bank address signals BA<1:L> when the second input control signal PIN<2> is inputted to the second pipe circuit 400. The second pipe circuit 400 may generate the first to $L^{th}$ auto-pre-charge address signals ABA<1:L> from the latched signals of the first to $L^{th}$ bank address signals BA<1:L> when the second output control signal POUT<2> is inputted to the second pipe circuit 400.

Figure 17:
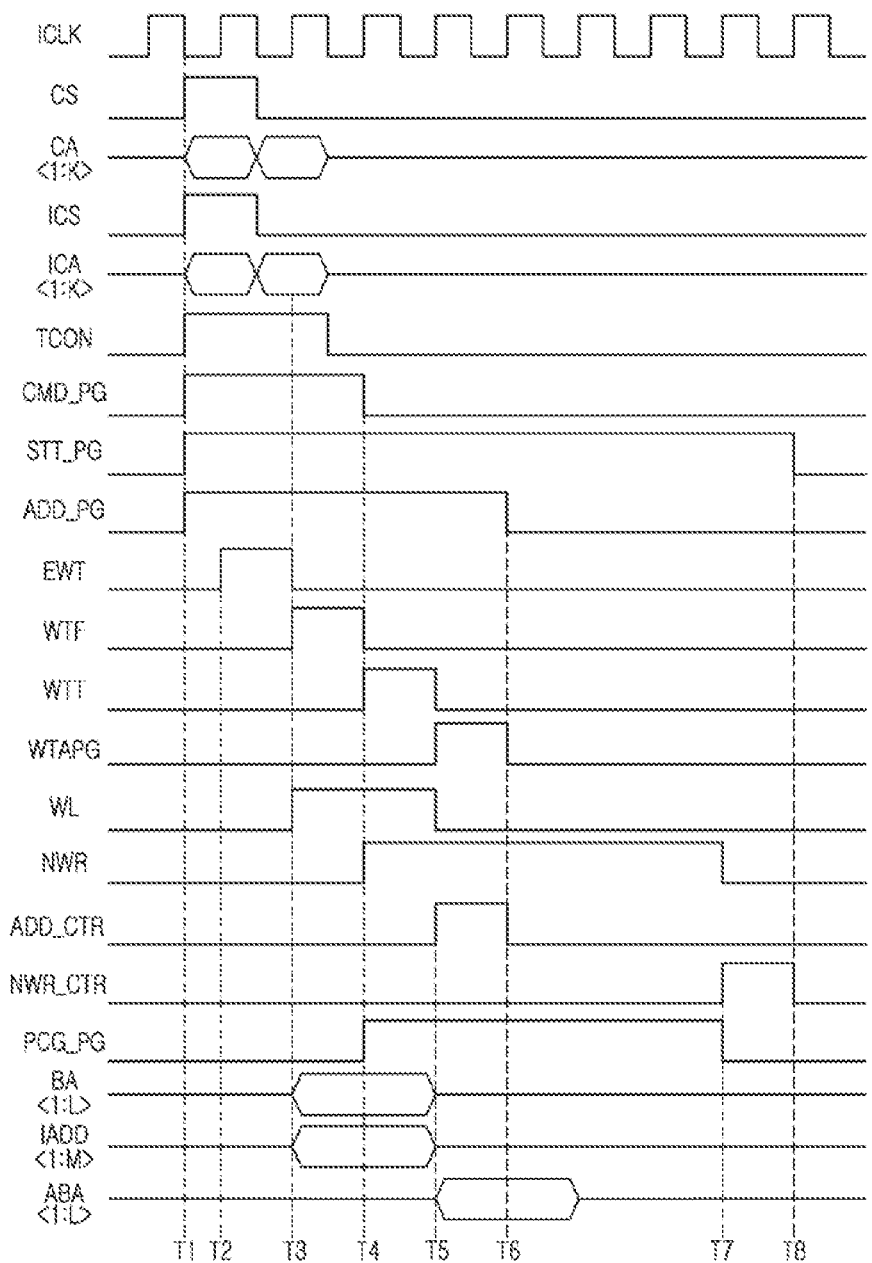
FIG. 17 is a timing diagram illustrating an operation of an electronic device according to an embodiment of the present disclosure.

An operation of the electronic device 100 according to an embodiment will be described hereinafter with reference to FIG. 17 in conjunction with a case for which the auto-pre-charge operation is performed after the write operation.

At a point in time "T1", the controller 110 may output the clock signal CLK, the chip selection signal CS having a logic "high" level, and the first to $K^{th}$ command/address signals CA<1:K> to perform the write operation and the auto-pre-charge operation.

The input control circuit 210 may buffer the chip selection signal CS and the first to $K^{th}$ command/address signals CA<1:K> using the second buffer 212 to generate the internal chip selection signal ICS and the first to $K^{th}$ internal command/address signals ICA<1:K>.

The internal clock generation circuit 220 may receive the clock signal CLK to generate the internal clock signal ICLK.

The transfer control signal generation circuit 231 may be synchronized with the internal clock signal ICLK to generate the transfer control signal TCON having a logic "high" level from the internal chip selection signal ICS.

The power control signal generation circuit 232 may be synchronized with the internal clock signal ICLK to generate the command power control signal CMD_PG which is enabled to have a logic "high" level by the transfer control signal TCON and the internal chip selection signal ICS. The power control signal generation circuit 232 may generate the status power control signal STT_PG which is enabled to have a logic "high" level by the internal chip selection signal ICS. The power control signal generation circuit 232 may generate the address power control signal ADD_PG which is enabled to have a logic "high" level by the internal chip selection signal ICS.

The first power supply circuit 241_1 may supply the power source voltage VDD and the ground voltage VSS to the decoder 241_2 while the command power control signal CMD_PG is enabled to have a logic "high" level.

The second power supply circuit 242_1 may supply the power source voltage VDD and the ground voltage VSS to the write control circuit 242_2 while the status power control signal STT_PG is enabled to have a logic "high" level.

The third power supply circuit 243_1 may supply the power source voltage VDD and the ground voltage VSS to the address generation circuit 243_2 while the address power control signal ADD_PG is enabled to have a logic "high" level.

At a point in time "T2", the decoder 241_2 may be driven by the power source voltage VDD and the ground voltage VSS to generate the write signal EWT which is enabled to have a logic "high" level because the internal chip selection signal ICS and the first to $K^{th}$ internal command/address signals ICA<1:K> have a logic level combination for performing the write operation and the auto-pre-charge operation.

The address generation circuit 243_2 may be driven by the power source voltage VDD and the ground voltage VSS to latch the first to $K^{th}$ internal command/address signals ICA<1:K> based on the write signal EWT having a logic "high" level.

At a point in time "T3", the shift circuit 233_1 may shift the write signal EWT, which is generated at the point in time "T2", in synchronization with the internal clock signal ICLK to generate the latency signal WL having a logic "high" level.

The write control circuit 2422 may be driven by the power source voltage VDD and the ground voltage VSS to generate the write flag signal WTF which is enabled to have a logic "high" level by shifting the write signal EWT generated at the point in time "T2".

The address generation circuit 243_2 may be driven by the power source voltage VDD and the ground voltage VSS to generate the first to $L^{th}$ bank address signals BA<1:L> and the first to $M^{th}$ internal address signals IADD<1:M> based on the first to $K^{th}$ internal command/address signals ICA<1:K> which are latched by the write flag signal WTF having a logic "high" level.

The I/O circuit 250 may buffer the data DATA outputted from the controller 110 to generate the internal data ID during the write operation.

The memory circuit 260 may perform the write operation for storing the internal data ID into memory cells selected by the write signal EWT, the first to $L^{th}$ bank address signals BA<1:L>, and the first to $M^{th}$ internal address signals IADD<1:M>

At a point in time "T4", the shift circuit 233_1 may shift the latency signal WL, which is generated at the point in time "T3", in synchronization with the internal clock signal ICLK to generate the recovery signal NWR.

The write control circuit 2422 may be driven by the power source voltage VDD and the ground voltage VSS to generate the write output control signal WTT which is enabled to have a logic "high" level by shifting the write flag signal WTF generated at the point in time "T3".

The power control signal generation circuit 232 may generate the pre-charge power control signal PCG_PG which is enabled to have a logic "high" level by the write output control signal WTT.

The fourth power supply circuit 244_1 may supply the power source voltage VDD and the ground voltage VSS to the pre-charge address generation circuit 244_2 while the pre-charge power control signal PCG_PG is enabled to have a logic "high" level.

The power control signal generation circuit 232 may be synchronized with the internal clock signal ICLK to generate the command power control signal CMD_PG which is disabled to have a logic "low" level by the transfer control signal TCON having a logic "low" level.

The first power supply circuit 241_1 may inhibit the power source voltage VDD and the ground voltage VSS from being supplied to the decoder 241_2 because the command power control signal CMD_PG which is disabled to have a logic "low" level.

The decoder 241_2 is not driven because the power source voltage VDD and the ground voltage VSS are not supplied to the decoder 241_2.

At a point in time "T5", the write control circuit 242_2 may be driven by the power source voltage VDD and the ground voltage VSS to generate the write pre-charge signal WTAPG which is enabled to have a logic "high" level by shifting the write output control signal WTT generated at the point in time "T4".

The signal delay circuit 233_2 may generate the address output control signal ADD_CTR having a logic "high" level from the status power control signal STT_PG based on the latency signal WL which is generated at the point in time "T3".

The pre-charge address generation circuit 244_2 may be driven by the power source voltage VDD and the ground voltage VSS to generate the first to $L^{th}$ auto-pre-charge address signals ABA<1:L> from the first to $L^{th}$ bank address signals BA<1:L> generated at the point in time "T3".

The memory circuit 260 may perform the auto-pre-charge operation based on the write pre-charge signal WTAPG and the first to $L^{th}$ auto-pre-charge address signals ABA<1:L>.

At a point in time "T6", the power control signal generation circuit 232 may be synchronized with the internal clock signal ICLK to generate the address power control signal ADD_PG which is disabled to have a logic "low" level by the address output control signal ADD_CTR having a logic "high" level which is generated at the point in time "T5".

The third power supply circuit 243_1 may inhibit the power source voltage VDD and the ground voltage VSS from being supplied to the address generation circuit 243_2 because the address power control signal ADD_PG is disabled to have a logic "low" level.

The address generation circuit 243_2 is not driven because the power source voltage VDD and the ground voltage VSS are not supplied to the address generation circuit 243_2.

At a point in time "T7", the power control signal generation circuit 232 may generate the pre-charge power control signal PCG_PG which is disabled to have a logic "low" level.

The fourth power supply circuit 244_1 may inhibit the power source voltage VDD and the ground voltage VSS from being supplied to the pre-charge address generation circuit 244_2 because the pre-charge power control signal PCG_PG is disabled to have a logic "low" level.

The pre-charge address generation circuit 244_2 is not driven because the power source voltage VDD and the ground voltage VSS are not supplied to the pre-charge address generation circuit 244_2.

The signal delay circuit 2332 may generate the recovery output control signal NWR_CTR having a logic "high" level from the status power control signal STT_PG based on the recovery signal NWR generated at the point in time "T4".

At a point in time "T8", the power control signal generation circuit 232 may be synchronized with the internal clock signal ICLK to generate the status power control signal STT_PG which is disabled to have a logic "low" level by the recovery output control signal NWR_CTR having a logic "high" level generated at the point in time "T7".

The second power supply circuit 242_1 may inhibit the power source voltage VDD and the ground voltage VSS from being supplied to the write control circuit 242_2 because the status power control signal STT_PG is disabled to have a logic "low" level.

The write control circuit 242_2 is not driven because the power source voltage VDD and the ground voltage VSS are not supplied to the write control circuit 242_2.

As described above, an electronic device according to an embodiment may supply power voltages to internal circuits included in a control circuit for controlling a write operation and an auto-pre-charge operation only during a necessary period, thereby reducing power consumption of the electronic device. In addition, the electronic device may inhibit the power voltages from being supplied to the internal circuits included in the control circuit during a period when operations of the internal circuits included in the control circuit are not required, thereby preventing unnecessary signals from being generated. Thus, it may be possible to reduce or prevent malfunctions of the electronic device.

Figure 18:
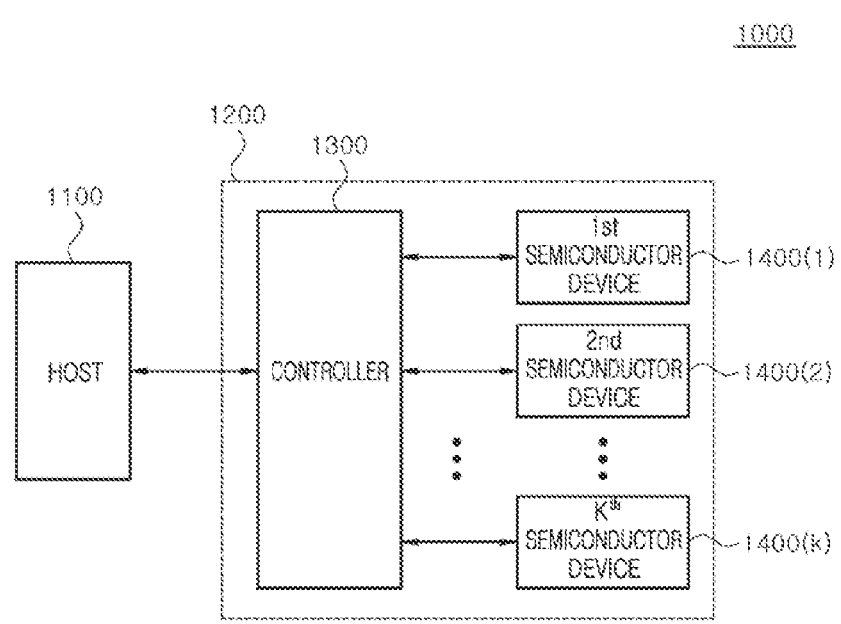
FIG. 18 is a block diagram illustrating a configuration of an electronic system employing the electronic device illustrated in FIGS. 1 to 17.

FIG. 18 is a block diagram illustrating a configuration of an electronic system 1000 according to an embodiment of the present disclosure. As illustrated in FIG. 18, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any of various interface protocols, such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that each of the semiconductor devices 1400(K:1) performs a write operation and an auto-pre-charge operation. Each of the semiconductor devices 1400(K:1) may supply power voltages to a control circuit for controlling the write operation and the auto-pre-charge operation only during a necessary period, thereby reducing power consumption of the semiconductor system 1200. In addition, each of the semiconductor devices 1400(K:1) may inhibit the power voltages from being supplied to the control circuit during a period when operations of the control circuit are not required, thereby preventing unnecessary signals from being generated. Thus, it may be possible to reduce or prevent malfunctions of the semiconductor system 1200.

The controller 1300 may be realized using the controller 110 illustrated in FIG. 1. Each of the semiconductor devices 1400(K:1) may be realized using the semiconductor device 120 illustrated in FIG. 1. In some embodiments, the semiconductor device 120 may be realized using dynamic random access memory (DRAM), phase change random access memory (PRAM), resistive random access memory (RRAM), magnetic random access memory (MRAM), or ferroelectric random access memory (FRAM).

What is claimed is:

1. An electronic device comprising:
    a control signal generation circuit configured to generate a command power control signal, a status power control signal, an address power control signal, and a pre-charge power control signal which are enabled to control a supply of power voltages during a write operation and an auto-pre-charge operation; and
    a control circuit configured to receive the power voltages to generate a write signal, a write pre-charge signal, a bank address signal, an internal address signal, and an auto-pre-charge address signal based on an internal chip selection signal and an internal command/address signal while the command power control signal, the status power control signal, the address power control signal, and the pre-charge power control signal are enabled.

2. The electronic device of claim 1, wherein the power voltages include a power source voltage and a ground voltage provided by an external device.

3. The electronic device of claim 1, wherein the control signal generation circuit is configured to:
    enable the command power control signal, the status power control signal, and the address power control signal at a point in time when the internal chip selection signal is inputted to the control signal generation circuit; and
    enable the pre-charge power control signal after a set period elapses from a point in time when the internal chip selection signal is inputted to the control signal generation circuit.

4. The electronic device of claim 1, wherein the control signal generation circuit includes:
    a transfer control signal generation circuit configured to latch the internal chip selection signal in synchronization with an internal clock signal and configured to shift the latched internal chip selection signal to generate a transfer control signal;
    a power control signal generation circuit configured to be synchronized with the internal clock signal to generate the command power control signal based on the internal chip selection signal, configured to generate the status power control signal and the address power control signal based on the internal chip selection signal, an address output control signal, and a recovery output control signal, and configured to generate the pre-charge power control signal based on a write output control signal and the recovery output control signal; and
    an output control signal generation circuit configured to be synchronized with the internal clock signal to generate the address output control signal and the recovery output control signal based on the write signal and the status power control signal.

5. The electronic device of claim 4, wherein the transfer control signal generation circuit includes:
    a transfer shift signal generation circuit configured to latch the internal chip selection signal in synchronization with the internal clock signal to generate a first transfer shift signal and configured to latch the first transfer shift signal in synchronization with the internal clock signal to generate a second transfer shift signal; and
    a signal synthesis circuit configured to synthesize the first transfer shift signal and the second transfer shift signal to generate the transfer control signal.

6. The electronic device of claim 4, wherein the power control signal generation circuit includes:
    a first pulse generation circuit configured to be synchronized with the internal clock signal to generate the command power control signal including a pulse which is generated based on the internal chip selection signal and the transfer control signal;
    a second pulse generation circuit configured to generate the status power control signal including a pulse which is generated based on the internal chip selection signal and the recovery output control signal;
    a third pulse generation circuit configured to generate the address power control signal including a pulse which is generated based on the internal chip selection signal and the address output control signal; and
    a fourth pulse generation circuit configured to generate the pre-charge power control signal including a pulse which is generated based on the write output control signal and the recovery output control signal.

7. The electronic device of claim 6, wherein the first pulse generation circuit includes:
    an internal pulse generation circuit configured to generate an internal pulse which is enabled during a predetermined period from a point in time when the internal chip selection signal is inputted to the internal pulse generation circuit; and
    a signal transfer circuit configured to be synchronized with the internal clock signal to generate the command power control signal which is enabled based on the internal pulse and the transfer control signal.

8. The electronic device of claim 4, wherein the output control signal generation circuit includes:
    a shift circuit configured to generate a recovery signal after generating a latency signal by shifting the write signal in synchronization with the internal clock signal;
    a signal delay circuit configured to be synchronized with the latency signal and the recovery signal to generate the address output control signal and the recovery output control signal based on the status power control signal.

9. The electronic device of claim 8, wherein the shift circuit includes:
   a first shift circuit configured to shift the write signal by a first period in synchronization with the internal clock to generate the latency signal; and
   a second shift circuit configured to shift the latency signal by a second period in synchronization with the internal clock to generate the recovery signal.

10. The electronic device of claim 8, wherein the signal delay circuit includes:
    a first latch circuit configured to be synchronized with the latency signal to latch the status power control signal and configured to delay the latched status power control signal to generate the address output control signal; and
    a second latch circuit configured to be synchronized with the recovery signal to latch the status power control signal and configured to delay the latched status power control signal to generate the recovery output control signal.

11. The electronic device of claim 1, wherein the control circuit includes:
    a first control circuit configured to be driven by receiving the power voltages while the command power control signal is enabled and configured to generate the write signal based on the internal chip selection signal and the internal command/address signal while the command power control signal is enabled;
    a second control circuit configured to be driven by receiving the power voltages while the status power control signal is enabled and configured to generate a write flag signal, a write output control signal, and the write pre-charge signal which are sequentially enabled based on the write signal while the status power control signal is enabled;
    a third control circuit configured to be driven by receiving the power voltages while the address power control signal is enabled and configured to generate the bank address signal and the internal address signal based on the write signal, the write flag signal, and the internal command/address signal while the address power control signal is enabled; and
    a fourth control circuit configured to be driven by receiving the power voltages while the pre-charge power control signal is enabled and configured to generate the auto-pre-charge address signal from the bank address signal based on the write output control signal and the write pre-charge signal while the pre-charge power control signal is enabled.

12. An electronic device comprising:
    a control signal generation circuit configured to generate a command power control signal and an address power control signal which are enabled to control a supply of power voltages during a write operation according to a logic level combination of an internal chip selection signal and an internal command/address signal; and
    a control circuit configured to receive the power voltages to generate a write signal, a bank address signal, and an internal address signal based on the internal chip selection signal and the internal command/address signal while the command power control signal and the address power control signal are enabled.

13. The electronic device of claim 12, wherein the power voltages include a power source voltage and a ground voltage provided by an external device.

14. The electronic device of claim 12, wherein the control signal generation circuit includes:
    a transfer control signal generation circuit configured to latch the internal chip selection signal in synchronization with an internal clock signal and configured to shift the latched internal chip selection signal to generate a transfer control signal;
    a power control signal generation circuit configured to be synchronized with the internal clock signal to generate the command power control signal based on the internal chip selection signal and configured to generate the address power control signal based on the internal chip selection signal and an address output control signal; and
    an output control signal generation circuit configured to shift the write signal in synchronization with the internal clock signal to generate the address output control signal.

15. The electronic device of claim 14, wherein the transfer control signal generation circuit includes:
    a transfer shift signal generation circuit configured to latch the internal chip selection signal in synchronization with the internal clock signal to generate a first transfer shift signal and configured to latch the first transfer shift signal in synchronization with the internal clock signal to generate a second transfer shift signal; and
    a signal synthesis circuit configured to synthesize the first transfer shift signal and the second transfer shift signal to generate the transfer control signal.

16. The electronic device of claim 14, wherein the power control signal generation circuit includes:
    a first pulse generation circuit configured to be synchronized with the internal clock signal to generate the command power control signal including a pulse which is generated based on the internal chip selection signal and the transfer control signal; and
    a second pulse generation circuit configured to generate the address power control signal including a pulse which is generated based on the internal chip selection signal and the address output control signal.

17. The electronic device of claim 16, wherein the first pulse generation circuit includes:
    an internal pulse generation circuit configured to generate an internal pulse which is enabled during a predetermined period from a point in time when the internal chip selection signal is inputted to the internal pulse generation circuit; and
    a signal transfer circuit configured to be synchronized with the internal clock signal to generate the command power control signal which is enabled based on the internal pulse and the transfer control signal.

18. The electronic device of claim 12, wherein the control circuit includes:
    a first control circuit configured to be driven by receiving the power voltages while the command power control signal is enabled and configured to generate the write signal based on the internal chip selection signal and the internal command/address signal while the command power control signal is enabled; and
    a second control circuit configured to be driven by receiving the power voltages while the address power control signal is enabled and configured to generate the bank address signal and the internal address signal based on the write signal, a write flag signal, and the internal command/address signal while the address power control signal is enabled.

19. The electronic device of claim 18, wherein the first control circuit includes:
 a first power supply circuit configured to output the power voltages while the command power control signal is enabled; and
 a decoder configured to decode the internal chip selection signal and the internal command/address signal to generate the write signal while the power voltages are supplied to the decoder.

20. The electronic device of claim 18, wherein the second control circuit includes:
 a second power supply circuit configured to output the power voltages while the address power control signal is enabled; and
 an address generation circuit configured to generate the bank address signal and the internal address signal based on the write signal, the write flag signal, and the internal command/address signal while the power voltages are supplied to the decoder.

21. The electronic device of claim 20, wherein the address generation circuit includes:
 a pipe control circuit configured to generate an input control signal which is enabled when the write signal is inputted to the pipe control circuit and configured to generate an output control signal which is enabled when the write flag signal is inputted to the pipe control circuit; and
 a pipe circuit configured to store the internal address signal when the input control signal is inputted to the pipe circuit and configured to generate the bank address signal and the internal address signal from the stored internal address signal when the output control signal is inputted to the pipe circuit.

* * * * *